(12) United States Patent
Parson

(10) Patent No.: US 6,473,309 B1
(45) Date of Patent: Oct. 29, 2002

(54) APPARATUS AND METHOD FOR MOUNTING A MOTHERBOARD TO A COMPUTER CHASSIS

(75) Inventor: Jerome W. Parson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 551 days.

(21) Appl. No.: 08/997,687

(22) Filed: Dec. 23, 1997

(51) Int. Cl.[7] .................................................. H05K 7/14
(52) U.S. Cl. ....................... 361/759; 361/753; 361/801; 24/304; 24/442
(58) Field of Search ................ 361/748, 752, 361/759, 799, 753, 785, 787, 801, 803; 439/59, 92, 95; 174/35 R, 51; 211/41.17; 206/706; 24/304, 442, 447, 452

(56) References Cited

U.S. PATENT DOCUMENTS

| | | | | |
|---|---|---|---|---|
| 3,585,569 A | * | 6/1971 | Moran | 439/371 |
| 5,136,470 A | * | 8/1992 | Sheridon et al. | 361/749 |
| 5,218,760 A | * | 6/1993 | Colton et al. | 29/845 |
| 5,398,156 A | * | 3/1995 | Steffes et al. | 361/683 |
| 5,452,184 A | * | 9/1995 | Scholder et al. | 361/799 |
| 5,668,699 A | * | 9/1997 | Bell et al. | 361/753 |
| 5,691,504 A | * | 11/1997 | Sands et al. | 361/174 X |
| 5,707,244 A | * | 1/1998 | Austin | 439/95 |
| 5,740,019 A | * | 4/1998 | Lee | 361/759 |
| 5,766,022 A | * | 6/1998 | Chapin et al. | 439/73 |
| 5,768,099 A | * | 6/1998 | Radloff et al. | 361/685 |
| 5,774,341 A | * | 6/1998 | Urbish et al. | 361/774 |

* cited by examiner

Primary Examiner—Jayprakash N. Gandhi
(74) Attorney, Agent, or Firm—Kenyon & Kenyon

(57) ABSTRACT

A method and apparatus for mounting a motherboard to a computer chassis wherein the motherboard includes a first integrated fastener member and the chassis includes a second integrated fastener member. The motherboard is mounted to the chassis by mating the first fastener member to the second fastener member.

36 Claims, 5 Drawing Sheets

APPARATUS AND METHOD FOR MOUNTING A MOTHERBOARD TO A COMPUTER CHASSIS

BACKGROUND OF THE INVENTION

1. Field of the Invention

The present invention relates to an apparatus and method for mounting a motherboard to a computer chassis. More specifically, the invention provides for mounting the motherboard to the chassis by using fasteners that replace the type of articles that are conventionally used to connect those components.

2. Description of the Related Art

Conventional methods for mounting a motherboard to a computer chassis use small hardware devices such as screws, rivets or studs. There are drawbacks to using these items to connect the motherboard to the chassis or to electrically ground the motherboard.

When using such objects to mount the motherboard to the chassis, an appropriate tool must be used, e.g., a screwdriver or riveter. Using tools to connect these components can damage the motherboard, if the tool slips during the assembly process. Additionally, the process of mounting the motherboard to the chassis may require working in tight spaces or require the use of small hardware and tools, which can make the assembly process difficult.

With respect to electrical grounding of the motherboard, the screws and rivets that are used to secure the board to the chassis can also serve as the grounding mechanisms. However, using these articles as the electrical grounds also presents drawbacks. Because they are typically small in size, these objects do not provide for a large grounding surface area. Therefore, an effective ground is not always achieved.

Due to the drawbacks addressed above with respect to conventional methods for mounting and grounding a motherboard to a computer chassis, there is a need for an improved method and apparatus for mounting a motherboard to a computer chassis and for grounding the motherboard.

SUMMARY OF THE INVENTION

A computer system that includes a motherboard that has a first integrated fastener member and a computer chassis that has a second integrated fastener member. The first integrated fastener member is engaged with the second integrated fastener member to connect the motherboard to the computer chassis.

DETAILED DESCRIPTION

Embodiments of the computer system of the present invention provide for securely mounting a motherboard to a computer chassis without requiring tools in the assembly process. Additionally, the computer system of the present invention can provide for a large-area grounding surface on the motherboard that can serve to improve the electrical grounding of the motherboard.

Figure 1:
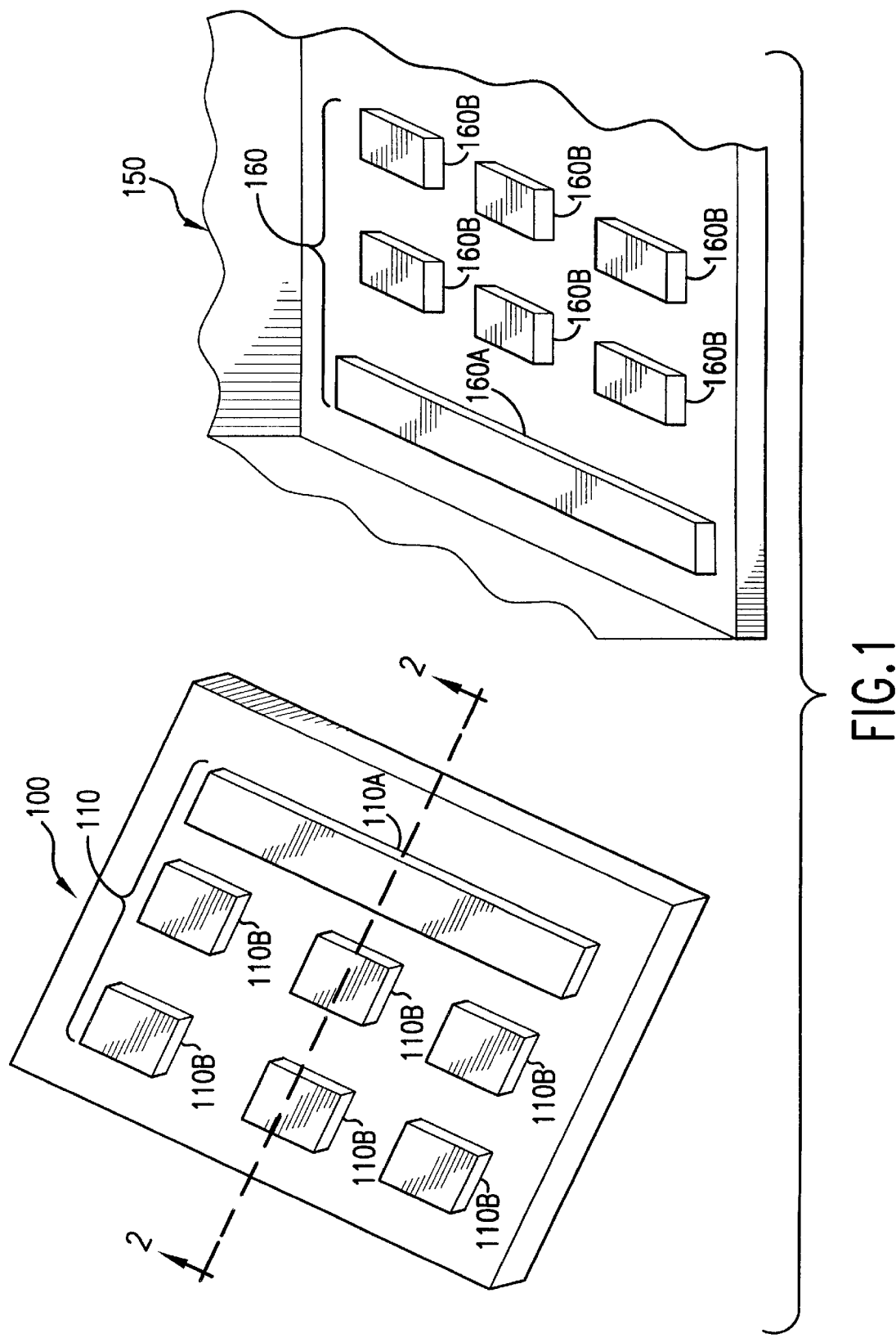
FIG. 1 is a partial cut-away perspective view of one embodiment for a mounting structure for the computer system of the present invention.

FIG. 1 illustrates one embodiment for the mounting structure of the computer system of the present invention. As can be seen, a motherboard 100 and a computer chassis 150, such as a computer chassis for an IBM compatible personal computer, are shown. The computer chassis 150 physically and electrically connects to the motherboard 100.

The computer system of the present invention comprises a motherboard that includes a first integrated fastener member and a chassis that includes a second integrated fastener member. The first integrated fastener member is engaged with the second integrated fastener member to connect the motherboard to the computer chassis. The first and second integrated fastener members may be attached or bonded to the motherboard and computer chassis, respectively. Alternatively, they may comprise protruding and/or recessed features that make up part of these components. For example, the motherboard could be molded such that the motherboard and the first integrated fastener member are formed from the same piece of material.

In the embodiment shown in FIG. 1, first integrated fastener member 110 is attached to one side of motherboard 100. First integrated fastener member 110 may be a single unit or may be composed of multiple segments, each of which are identical in function but which may be formed from different materials or have different sizes and shapes. FIG. 1 illustrates first fastener member 110 being formed of multiple segments, namely segments 110A and 110B. As can be seen, a single rectangular-shaped segment 110A is provided and multiple, identically formed square-shaped segments 110B are included on the same side of motherboard 100. Second integrated fastener member 160 is attached to computer chassis 150 and has segments shaped similarly to those of first fastener member 110, namely in segments 160A and 160B.

First fastener member 110, and thus segments 110A and 110B, may be hook components of a "hook and loop" fastener assembly and second fastener member 160, and thus segments 160A and 160B, may be the loop components of a hook and loop assembly. As such, when first fastener member 110 is brought into contact with second fastener member 160 the two members securely mate together, and consequently, motherboard 100 and computer chassis 150, to which the fasteners 110 and 160 are attached, are also securely fastened together. Thus, motherboard 100 can be securely mounted to computer chassis 150 without requiring the use of tools. Additionally, the motherboard may be easily detached from the computer chassis without requiring tools. To detach the motherboard, the assembler would merely grasp the two pieces and pull them apart. Since the first and second fastener members may be attached and detached by hand, i.e., without requiring tools, they comprise a hand-operable mounting structure.

Fastener members 110 and 160 may both be constructed of an electrically conductive material, such as, for example, carbon impregnated fiber. Constructing the fastener members from an electrically conductive material allows for the fasteners to be used as an electrical ground for the motherboard.

As stated above, first fastener member 110 is comprised of segments 110A and 110B and second fastener member 160 is comprised of segments 160A and 160B. Both fastener members, including all of the segments that comprise them, are constructed of the same material. The only difference between first fastener segments 110A and 110D, and also between second fastener segments 160A and 160B, are their sizes and shapes. As shown in FIG. 1, first fastener segment 110A, and second fastener segment 160A, are rectangular in shape and first fastener segments 110B and second fastener segments 160B are square-like in shape. Segments 110B and 160B have smaller surface areas than segments 110A and 160A. However, the size and shape of fastener segments 110A and 160A, and segments 110B and 160B, are not required to be those as illustrated in FIG. 1. The only requirement is that first fastener segments 111A and 110B and second fastener segments 160A and 160B be shaped and positioned on board 100 and computer chassis 150 such that when board 100 is mounted to computer chassis 150, segments 110A and 110B mate with segments 160A and 16DB.

One factor in determining the size, shape and positioning of the fastener segments on the motherboard and the chassis is the available surface area on the board and the chassis for attaching the fastener segments. The fastener segments must be sized and positioned such that they do not interfere with any components on either the board or the chassis.

Further with respect to the shape of first fastener segments 110A, 110B and second fastener segments 160A, 160B, it is desirable that the total surface area for the fastener members, i.e., the aggregate surface area for all segments of a particular fastener member, be as large as possible. Configuring the fastener members to include as large a surface area as possible is desirable since the fastener members may serve as the electrical ground for the motherboard and the chassis. Therefore, providing for as large a surface area as possible for the fastener members should provide an effective ground for the board when mounted to the chassis.

First fastener segments 110A, 110B and second fastener segments 160A, 160B may be attached to motherboard 100 and computer chassis 150, respectively, by using an electrically conductive adhesive. By using an electrically conductive adhesive, the fastener segments may effectively function as an electrical ground, as discussed above, for the motherboard. It also may be desirable to use an adhesive that is thermally conductive as well as electrically conductive. While not required for practicing the present invention, the use of a thermally conductive material could enhance the dissipation of heat from the motherboard. Examples of thermally and electrically conductive adhesives that could be utilized with the present invention are those that are produced by RBC Industries, Inc., namely pure silver thixotropic paste (product number RBC-6100), pure silver filled one part thixotropic paste (RBC-6200), and low cost, nickel filled thixotropic paste (RBC-6400). However, other adhesives having the desired properties could be used as well.

Alternatively, in order to achieve the conductive properties addressed above, general purpose adhesives, and the fiber utilized to construct fastener members 110 and 160, could be impregnated with conductive powder flakes or spheres made from nickel, aluminum or copper. An example of nickel powder for possible use in the fibers and/or adhesives is Novamet® Conductive Nickel Flake Powder Type HCA-1. This powder is expected to make adhesives and fiber both electrically and thermally conductive. Another possible material for use as described above is Novamet® Nickel Coated Graphite-60.

Figure 2:
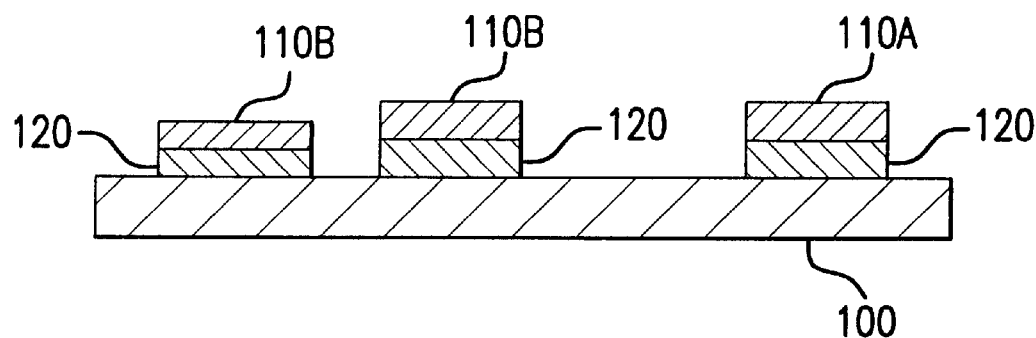
FIG. 2 is a cross-sectional view of the mounting structure as shown in FIG. 1, taken along line 2—2.

FIG. 2 is a cross-sectional view of the motherboard 100 with first fastener segments 110A and 110B attached. A thin layer of an electrically and thermally conductive adhesive 120 is shown attaching the first fastener segments to the motherboard. Second fastener segments 160A and 160B (not shown) can be attached to computer chassis 150 in the same way.

Figure 3:
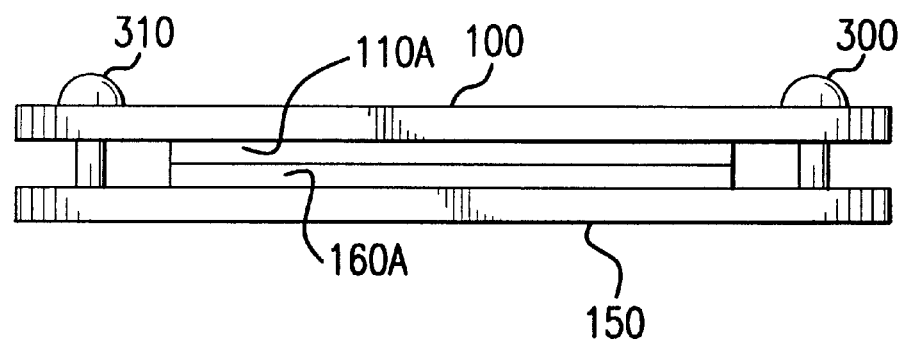
FIG. 3 is a side view of a motherboard and computer chassis mated together by using the mounting structure for the computer system of FIG. 1.

FIG. 3 illustrates board 100 mounted to computer chassis 150 by mating the first fastener member to the second fastener member in accordance with an embodiment of the present invention. As can be seen, board 100 lies substantially co-planar with a surface of computer chassis 150. When rectangular first fastener segment 110A contacts second fastener segment 160A, first segment 110A securely mates with second segment 160A. When rectangular first segment 110A mates with rectangular second segment 160A, the square-shaped segments of the first and second fastener members, namely segments 110B and 160B (not shown), respectively, also mate. This can provide a secure physical bond and electrical ground between board 100 and computer chassis 150.

FIG. 3 also illustrates hardware connecting devices 300 and 310, which can be used with an embodiment of the present invention. Whereas it is desirable to eliminate, or at least reduce, the number of these hardware components to as few as possible, their use may be desirable to augment the bond established between the first and second fastener members in certain circumstances. For example, their use may be desired for heavier motherboards, such as those that include one or more heat sinks. The present invention should enable the number of screws, rivets, etc. that are used to be significantly reduced.

Although FIG. 3 shows screws 300 and 310, other connecting devices, such as studs, can be used instead. The number and installation location of these hardware items depends upon the unique mounting requirements of the particular application.

Several variations on the disclosed embodiments are contemplated. As described above, the first fastener member is attached to the motherboard and the second fastener member is attached to the computer chassis. However, it is not required that the first fastener member be attached to the motherboard and the second fastener member be attached to the computer chassis. The first fastener member may be attached to the computer chassis and the second fastener member may be attached to the motherboard without departing from the spirit of the present invention.

As an alternative to making first and second fastener members from carbon impregnated fiber, other materials having the desired properties could be used. Additionally, whereas it is desirable that the material used for constructing the fastener members be electrically conductive, and that the adhesive be electrically conductive, such that the fastener can function as an electrical ground, it is not required. Embodiments of the present invention can function as an efficient method of mounting a motherboard to a computer chassis without also functioning as an electrical ground. If electrically conductive material is not used for the fastener members and the adhesive, a separate ground may be required.

First fastener member 110 and second fastener member 160 are each disclosed as being comprised of multiple segments that are either rectangular or square. However, it is not required that the first and second fastener members be comprised of multiple segments. They can be singular elements in composition. Furthermore, if multiple segments are used for the fastener members, the segments may be of any shape and size and may be positioned in various positions on the motherboard and chassis.

Additionally, whereas it is disclosed that the first and second fastener members together comprise a hook and loop fastener assembly, it is not required that a hook and loop configuration be used. Additional types of securing devices could be utilized for the first fastener member and the second fastener member.

Figure 4:
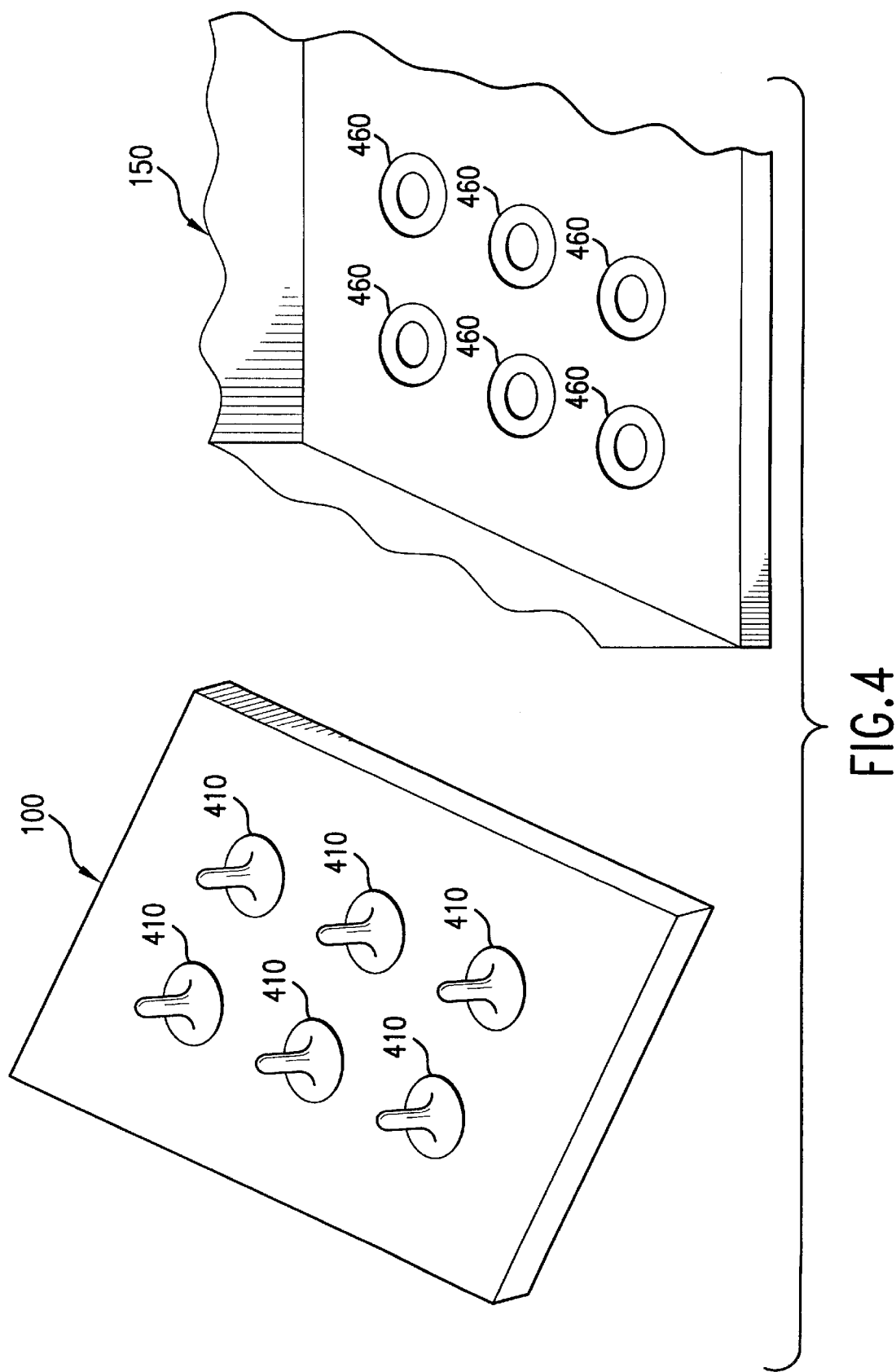
FIG. 4 is a partial cut-away perspective view for a second embodiment for a mounting structure for the computer system of the present invention.
Figure 5:
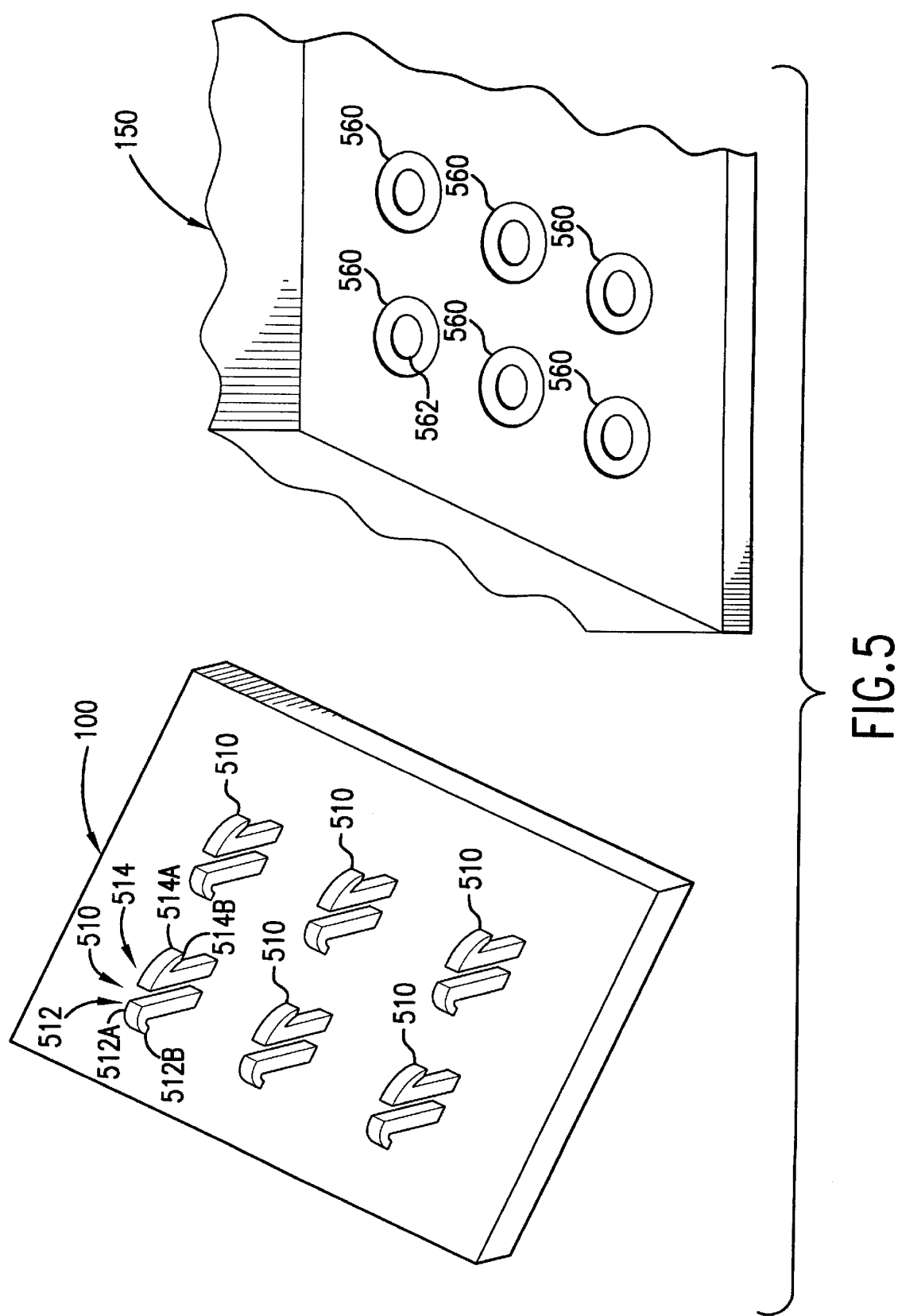
FIG. 5 is a partial cut-away perspective view for a third embodiment for a mounting structure for the computer system of the present invention.
Figure 6:
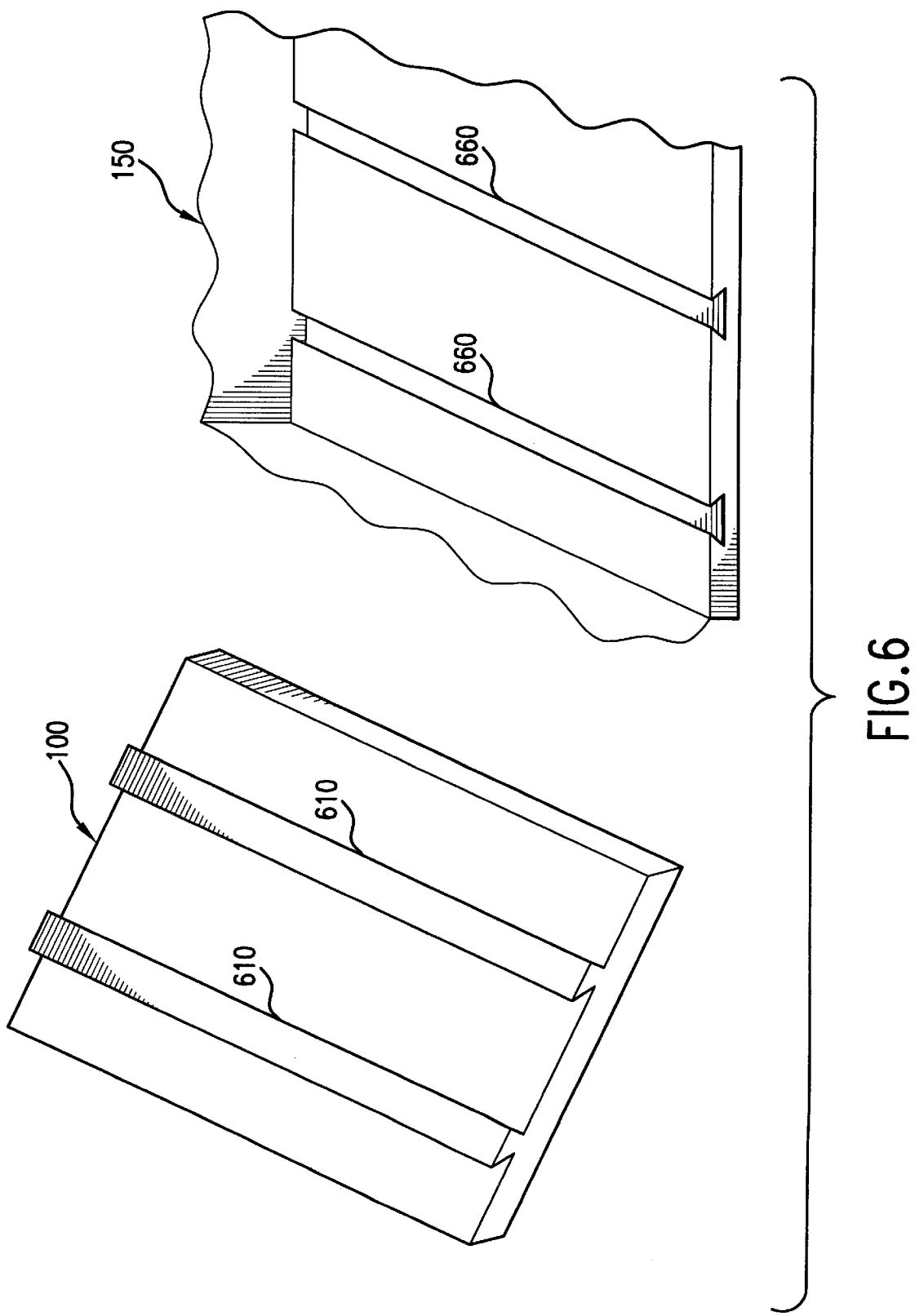
FIG. 6 is a partial cut-away perspective view for a fourth embodiment for a mounting structure for the computer system of the present invention.

FIGS. 4–6 illustrate alternative embodiments for configurations of first and second fastener members that can be used when practicing the present invention. FIG. 4 illustrates a snap fastener device where the first fastener member 410 is the male portion of the snap and is attached to one side of motherboard 100. Second fastener member 460 is the female portion of the snap and is attached to chassis 150. The male member 410 is received within the female member 460 to secure the motherboard 100 to the computer chassis 150. The snap fastener could be manufactured of electrically conductive material and be attached to the motherboard and chassis with an electrically conductive adhesive such that the fastener could still function as an electrical ground for the board.

FIG. 5 illustrates an embodiment for the first and second fastener members where the members are integrally formed with the motherboard and the chassis. As can be seen, first member 510 is integrally molded on one side of motherboard 100 and consists of two prongs 512 and 514. The prongs 512 and 514 include cam surfaces 512A and 514A, respectively, and engagement portions 512B and 514B, respectively. Second member 560 is integrally formed in computer chassis 150 and contains opening 562 that receives the two prongs 512 and 514 of first member 510 within it. As first member 510 contacts second member 560 and is inserted inside opening 562, cam surfaces 512A and 514A act against the surface defining opening 562 to bias prongs 512 and 514 together such that the prongs are able to be inserted into and through opening 562. As cam surfaces 512A and 514A pass beyond the surface defining opening 562, prongs 512 and 514 spring outward and engagement portions 512B and 514B engage the underside of the surface defining opening 562. In this manner, motherboard 100 is secured to computer chassis 150. To release motherboard 100 from chassis 150 the assembler has access to prongs 512 and 514 of first member 510 from the underside of computer chassis 150. The assembler merely press the prongs together such that they may be pulled up and through opening 562. In the embodiment of FIG. 5, any number of first fastener members 510 and corresponding second fastener members 560 can be provided.

FIG. 6 illustrates a tongue and groove configuration for the mounting structure of the computer system of the present invention. First fastener member 610 is the tongue component of the fastener assembly and is integrally formed on one side of motherboard 100. Second fastener member 660 is the groove component and is integrally formed in computer chassis 150. First fastener member 610 is received within second fastener member 660 to secure motherboard 100 to chassis 150. Again, any number of first fastener members and second fastener members can be provided on the motherboard and the computer chassis.

The disclosed embodiments are illustrative of the various ways in which the present invention may be practiced. Other embodiments can be implemented by those skilled in the art without departing from the spirit and scope of the present invention.

What is claimed is:

1. A computer system comprising:
a motherboard that includes a first fastener member; and
a computer chassis that includes a second fastener member;
wherein one of the first and second fastener members is a hook component of a hook and loop fastener assembly and the other of the first and second fastener members is a loop component of the hook and loop fastener assembly and wherein each of said first and second fastener members include a plurality of fibers;
the first fastener member engaged with the second fastener member, connecting the motherboard to the computer chassis.

2. The computer system of claim 1 wherein each of said plurality of fibers are carbon impregnated fibers.

3. The computer system of claim 1 wherein an adhesive bonds the first fastener member to the motherboard and bonds the second fastener member to the chassis.

4. The computer system of claim 3 wherein the adhesive is electrically conductive.

5. The computer system of claim 3 wherein the adhesive is thermally conductive.

6. The computer system of claim 1 wherein the first fastener member and the second fastener member each include a plurality of segments.

7. The computer system of claim 6 wherein at least two of the plurality of segments have different shapes.

8. A computer system comprising:
first means for mating a motherboard to a computer chassis; and
second means for mating the motherboard to the computer chassis;
the first means including a structural member integrally molded with the motherboard and the second means included on the computer chassis, the first means engaged with the second means, connecting the motherboard to the computer chassis.

9. The computer system of claim 8 wherein said structural member is a snap fastener device including a circular base portion, an elongated stem portion extending from said base portion at a first end, and a head portion formed at a second end of said elongated stem portion.

10. The computer system of claim 8 wherein said structural member includes a first prong and a second prong, said first and second prongs extending perpendicular from the motherboard and wherein each of said prongs includes a cam surface and an engagement portion, said engagement portion adapted to mate with the second means.

11. The computer system of claim 8 wherein said structural member is an elongated tongue extending substantially along the length of the motherboard.

12. A motherboard that includes a fastener member for connecting the motherboard to a computer chassis, wherein said fastener member comprises at least one component of a hook and loop fastener assembly and wherein said at least one component includes a plurality of fibers.

13. The motherboard of claim 12 wherein each of said plurality of fibers are carbon impregnated fibers.

14. The motherboard of claim 12 wherein an adhesive bonds said fastener member to the motherboard.

15. The motherboard of claim 14 wherein the adhesive is electrically conductive.

16. The motherboard of claim 14 wherein the adhesive is thermally conductive.

17. The motherboard of claim 12 wherein said fastener member includes a plurality of segments.

18. The motherboard of claim 17 wherein at least two of the plurality of segments have different shapes.

19. A computer chassis having a fastener member for connecting the computer chassis to a motherboard, wherein said fastener member comprises at least one component of a hook and loop fastener assembly and wherein said at least one component includes a plurality of fibers.

20. The computer chassis of claim 19 wherein each of said plurality of fibers are carbon impregnated fibers.

21. The computer chassis of claim 19 wherein an adhesive bonds said fastener member to the chassis.

22. The computer chassis of claim 21 wherein the adhesive is electrically conductive.

23. The computer chassis of claim 21 wherein the adhesive is thermally conductive.

24. The computer chassis of claim 19 wherein said fastener member includes a plurality of segments.

25. The computer chassis of claim 24 wherein at least two of the plurality of segments have different shapes.

26. A method for mounting a motherboard to a computer chassis comprising the steps of:

attaching a first fastener member to a motherboard;

attaching a second fastener member to a computer chassis;

wherein one of the first and second fastener members is a hook component of a hook and loop fastener assembly and the other of the first and second fastener members is a loop component of the hook and loop fastener assembly and wherein each of said first and second fastener members include a plurality of fibers; and mounting the motherboard to the chassis by mating the first fastener member to the second fastener member.

27. The method of claim 26 wherein each of said plurality of fibers are carbon impregnated fibers.

28. The method of claim 26 wherein an adhesive is used to attach the first fastener member to the motherboard and to attach the second fastener member to the chassis.

29. The method of claim 28 wherein the adhesive is electrically conductive.

30. The method of claim 28 wherein the adhesive is thermally conductive.

31. The method of claim 26 wherein the first fastener member and the second fastener member each include a plurality of segments.

32. The method of claim 31 wherein at least two of the plurality of segments have different shapes.

33. A method for mounting a motherboard to a computer chassis comprising:

mating a first structural member integrally formed with the motherboard to a second member included on the computer chassis.

34. The method of claim 33 wherein said structural member is a snap fastener device including a circular base portion, an elongated stem portion extending from said base portion at a first end, and a head portion formed at a second end of said elongated stem portion.

35. The method of claim 33 wherein said structural member includes a first prong and a second prong, said first and second prongs extending perpendicular from the motherboard and wherein each of said prongs includes a cam surface and an engagement portion, said engagement portion adapted to mate with said second member.

36. The method of claim 33 wherein said structural member is an elongated tongue extending substantially along the length of the motherboard.

* * * * *